(12) United States Patent  (10) Patent No.: US 11,594,160 B2
Sun et al.  (45) Date of Patent: Feb. 28, 2023

(54) PIXEL DETECTION CIRCUIT, DISPLAY APPARATUS, AND DETECTION METHOD

(71) Applicants: CHONGQING BOE DISPLAY TECHNOLOGY CO., LTD., Chongqing (CN); BOE TECHNOLOGY GROUP CO., LTD., Beijing (CN)

(72) Inventors: Shicheng Sun, Beijing (CN); Jonguk Kwak, Beijing (CN); Dawei Shi, Beijing (CN); Wei Zhang, Beijing (CN); Cunzhi Li, Beijing (CN); Pei Wang, Beijing (CN)

(73) Assignees: CHONGQING BOE DISPLAY TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 298 days.

(21) Appl. No.: 16/943,321

(22) Filed: Jul. 30, 2020

(65) Prior Publication Data
US 2021/0090480 A1  Mar. 25, 2021

(30) Foreign Application Priority Data
Sep. 20, 2019 (CN) .......................... 201910894057.3

(51) Int. Cl.
*G09G 3/00* (2006.01)
*H01L 27/32* (2006.01)

(52) U.S. Cl.
CPC ......... *G09G 3/006* (2013.01); *H01L 27/3272* (2013.01); *H01L 27/3276* (2013.01)

(58) Field of Classification Search
CPC . G09G 3/006; G09G 2330/12; H01L 27/3272
See application file for complete search history.

(56) References Cited

U.S. PATENT DOCUMENTS 6,853,364 B2 *  2/2005  Kai ...................... G09G 3/3688
                                                        438/30
2019/0066556 A1 *  2/2019  Abe ...................... G09G 3/006

* cited by examiner

*Primary Examiner* — Kevin M Nguyen
(74) *Attorney, Agent, or Firm* — Kinney & Lange, P.A.

(57) ABSTRACT

A pixel detection circuit includes a wire, at least one detection signal input terminal, at least one detection signal output terminal, and a first pixel drive circuit comprising a first switch circuit, a second switch circuit, and a third switch circuit. A display apparatus including the pixel detection circuit and a detection method applied to the pixel detection circuit are further provided.

11 Claims, 4 Drawing Sheets

PIXEL DETECTION CIRCUIT, DISPLAY APPARATUS, AND DETECTION METHOD

CROSS-REFERENCE TO RELATED APPLICATION

This application claims the benefit of Chinese Patent Application No. 201910894057.3 filed with the CNIPA on Sep. 20, 2019, the whole disclosure of which is incorporated herein by reference.

TECHNICAL FIELD

The present disclosure relates to detection of display apparatuses, in particular to a pixel detection circuit, a display apparatus, and a detection method.

BACKGROUND

With the continuous innovation of display technology, flexible OLED (Organic Light-Emitting Diode) has become the most popular in recent years, and is used more and more widely. Although the flexible OLED has many advantages, edges of flexible products are more prone to crack, which may cause package failure or display abnormalities in the subsequent manufacturing process. Therefore, it is necessary to design a circuit for detecting the crack of flexible display panel and a detection method based on the circuit.

SUMMARY

The present disclosure provides a pixel detection circuit, comprising: a wire arranged on an edge of a display panel to be detected; at least one detection signal input terminal electrically connected to one end of the wire; at least one detection signal output terminal electrically connected to the other end of the wire; and a first pixel drive circuit, comprising: a first switch circuit having a first terminal electrically connected to a first control signal line, a second terminal electrically connected to a first data signal line, and a third terminal electrically connected to a first column of pixels, the first switch circuit being configured to provide a potential of the second terminal of the first switch circuit to the third terminal of the first switch circuit under the control of the first terminal of the first switch circuit; a second switch circuit having a first terminal electrically connected to a second control signal line, a second terminal electrically connected to a second data signal line, and a third terminal electrically connected to a second column of pixels, the second switch circuit being configured to provide a potential of the second terminal of the second switch circuit to the third terminal of the second switch circuit under the control of the first terminal of the second switch circuit; and a third switch circuit having a first terminal electrically connected to one of the at least one detection signal output terminal, a second terminal electrically connected to the third terminal of the first switch circuit, and a third terminal electrically connected to the second column of pixels, the third switch circuit being configured to provide a potential of the second terminal of the third switch circuit to the third terminal of the third switch circuit under the control of the first terminal of the third switch circuit.

For example, the first switch circuit comprises: a first transistor having a control electrode serving as the first terminal of the first switch circuit, a first electrode serving as the second terminal of the first switch circuit, and a second electrode serving as the third terminal of the first switch circuit.

For example, the second switch circuit comprises: a second transistor having a control electrode serving as the first terminal of the second switch circuit, a first electrode serving as the second terminal of the second switch circuit, and a second electrode serving as the third terminal of the second switch circuit.

For example, the third switch circuit comprises a third transistor and a fourth transistor, wherein the third transistor has a control electrode electrically connected to a third control signal line, a first electrode serving as the second terminal of the third switch circuit, and a second electrode electrically connected to a first electrode of the fourth transistor; and wherein the fourth transistor has a control electrode serving as the first terminal of the third switch circuit, and a second electrode serving as the third terminal of the third switch circuit.

For example, a pixel detection circuit further comprising a second pixel drive circuit configured to drive a third column of pixels and a fourth column of pixels, wherein the second pixel drive circuit comprises: a fourth switch circuit having a first terminal electrically connected to a fourth control signal line, a second terminal electrically connected to a fourth data signal line, and a third terminal electrically connected to the third column of pixels, the fourth switch circuit being configured to provide a potential of the second terminal of the fourth switch circuit to the third terminal of the fourth switch circuit under the control of the first terminal of the fourth switch circuit; a fifth switch circuit having a first terminal electrically connected to the second control signal line, a second terminal electrically connected to the second data signal line, and a third terminal electrically connected to a fourth column of pixels, the fifth switch circuit being configured to provide a potential of the second terminal of the fifth switch circuit to the third terminal of the fifth switch circuit under the control of the first terminal of the fifth switch circuit; and a sixth switch circuit having a first terminal electrically connected to another detection signal output terminal of the at least one detection signal output terminal, a second terminal electrically connected to the third terminal of the fourth switch circuit, and a third terminal electrically connected to the fourth column of pixels, the sixth switch circuit being configured to provide a potential of the second terminal of the sixth switch circuit to the third terminal of the sixth switch circuit under the control of the first terminal of the sixth switch circuit.

For example, the fourth switch circuit comprises a fifth transistor having a control electrode serving as the first terminal of the fourth switch circuit, a first electrode serving as the second terminal of the fourth switch circuit, and a second electrode serving as the third terminal of the fourth switch circuit.

For example, the fifth switch circuit comprises a sixth transistor having a control electrode serving as the first terminal of the fifth switch circuit, a first electrode serving as the second terminal of the fifth switch circuit, and a second electrode serving as the third terminal of the fifth switch circuit.

For example, the sixth switch circuit comprises a seventh transistor and an eighth transistor; wherein the seventh transistor has a control electrode electrically connected to a third control signal line, a first electrode serving as the second terminal of the sixth switch circuit, and a second electrode electrically connected to a first electrode of the eighth transistor; and wherein the eighth transistor has a control electrode serving as the first terminal of the sixth switch circuit, and a second electrode serving as the third terminal of the sixth switch circuit.

The present disclosure further provides a display apparatus comprising the aforementioned pixel detection circuit.

The present disclosure provides a detection method applied to the aforementioned pixel detection circuit, comprising: receiving, by the first terminal of the first switch circuit, a first level signal output by the first control signal line, and the first switch circuit is turned on, to provide a first data signal from the first data signal line received by the second terminal of the first switch circuit to the third terminal of the first switch circuit, and the first column of pixels do not emit light; receiving, by the first terminal of the second switch circuit, a second level signal output by the second control signal line, and the second switch circuit is turned off; in response to a detection signal being received at the detection signal output terminal, the third switch circuit outputs the first data signal to the second column of pixels, and the second column of pixels do not emit light; and in response to the detection signal being not received at the detection signal output terminal, the third switch circuit is turned off, and the second column of pixels emit light.

For example, the third switch circuit comprises the third transistor and the fourth transistor; wherein the method further comprises: receiving, by the control electrode of the third transistor, a third level signal output by the third control signal line, and the third transistor is turned on; in response to the detection signal being received at the control electrode of the fourth transistor, the fourth transistor is turned on, and the first data signal is transmitted to the second column of pixels through the third transistor and the fourth transistor, and the second column of pixels do not emit light; and in response to the detection signal being not received at the control electrode of the fourth transistor, the fourth transistor is turned off, and the first data signal is not transmitted to the second column of pixels through the third transistor and the fourth transistor, and the second column of pixels emit light.

BRIEF DESCRIPTION OF THE ACCOMPANYING DRAWINGS

The above and/or additional aspects and advantages of the present disclosure will become apparent and easy to understand from the following description of the embodiments in conjunction with the accompanying drawings, in which.

DETAILED DESCRIPTION

The embodiments of the present disclosure are described in detail below. Examples of the embodiments are shown in the drawings, in which the same or similar reference numerals indicate the same or similar elements or elements having the same or similar functions throughout. The embodiments described below with reference to the drawings are illustrative for explaining the present disclosure, and should not be construed as limiting the present disclosure.

Those skilled in the art can understand that unless otherwise defined, all terms (including technical and scientific terms) used herein have the same meaning as those generally understood by those ordinary skilled in the art to which the present disclosure belongs. It should also be understood that terms such as those defined in a general dictionary should be understood to have a meaning consistent with the meaning in the context of the relevant technology, and unless specifically defined as here, it would not be interpreted in an idealized or overly formal sense.

Those skilled in the art can understand that unless specifically stated, the singular forms "a", "an", "said" and "the" used herein may also include the plural forms. It should be further understood that the word "comprising" or "including" used in the specification of the present disclosure refers to the presence of the described features, integers, steps, operations, elements, components and/or groups thereof, but does not exclude the presence or addition of one or more other features, integers, steps, operations, elements, components, and/or groups thereof. The expression "and/or" as used herein includes all or any unit and all combinations of one or more associated listed items. The applicant of the present disclosure conducted research and found that a PCD (Panel Crack Detect) circuit is provided in related art to detect whether the display panel is cracked, for example, by detecting whether the PCD circuit lights the display panel. However, adding a PCD circuit for detection not only occupies the design space, but also causes a problem of abnormal display if the PCD circuit is abnormal or defective. Therefore, it is necessary to provide a new circuit for detecting the crack of the flexible display panel and a detection method based on the circuit.

Figure 1:
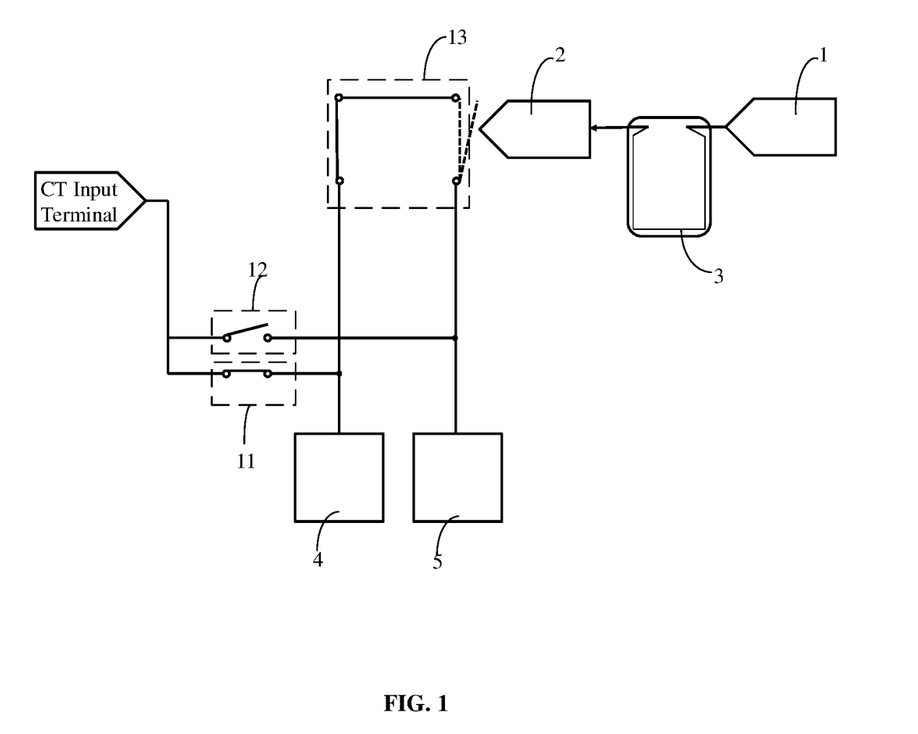
FIG. 1 shows a schematic diagram of the principle of a pixel detection circuit according to an embodiment of the present disclosure.

The applicant of the present disclosure conducted further research and designed the principle diagram of the pixel detection circuit shown in FIG. 1. The applicant provided at least one detection signal input terminal 1 and at least one detection signal output terminal 2, and then connected the at least one detection signal input terminal 1 and the at least one detection signal output terminal 2 using a wire 3, so as to form a detection circuit. A detection signal may be output to a third switch circuit 13 via the detection signal input terminal 1, the wire 3, and the detection signal output terminal 2, so that the third switch circuit 13 is turned on. A CT (Cell Test) input terminal outputs a first data signal, and when the first switch circuit 11 is in ON state, the first data signal is output to a first column of pixels 4, so that a first light-emitting element of the first column of pixels 4 does not emit light. The second switch circuit 12 remains off, and the first data signal cannot be output to a second column of pixels 5 through the second switch circuit 12. The detection signal may be transmitted to the third switch circuit 13 via the detection signal input terminal 1, the wire 3, and the detection signal output terminal 2 in sequence, so that the third switch circuit 13 is turned on, and the first data signal may be written into a second light-emitting element of the second column of pixels 5 via the first switch circuit 11 and the third switch circuits 13. If the second light-emitting element of the second column of pixels 5 does not emit light, it is considered that the second light-emitting element of the second column of pixels 5 has received the first data signal, and it is determined that the wire 3 is not broken. If the second light-emitting element of the second column of pixels 5 emits light, it is considered that the second light-emitting element of the second column of pixels 5 did not receive the first data signal, and it is determined that the wire 3 is broken. This is because the breakage of the wire 3 disables the detection signal to be transmitted to the third switch circuit 13, then the third switch circuit 13 is in OFF state, and the first data signal cannot be written into the second light-emitting element of the second column of pixels 5.

The technical solutions of the present disclosure and how the technical solutions of the present disclosure solve the above technical problem will be described in detail in the following embodiments. The following several embodiments may be combined with each other, and the same or similar concepts or processes may not be repeated in some embodiments. The embodiments of the present disclosure will be described below in conjunction with the drawings.

Figure 2:
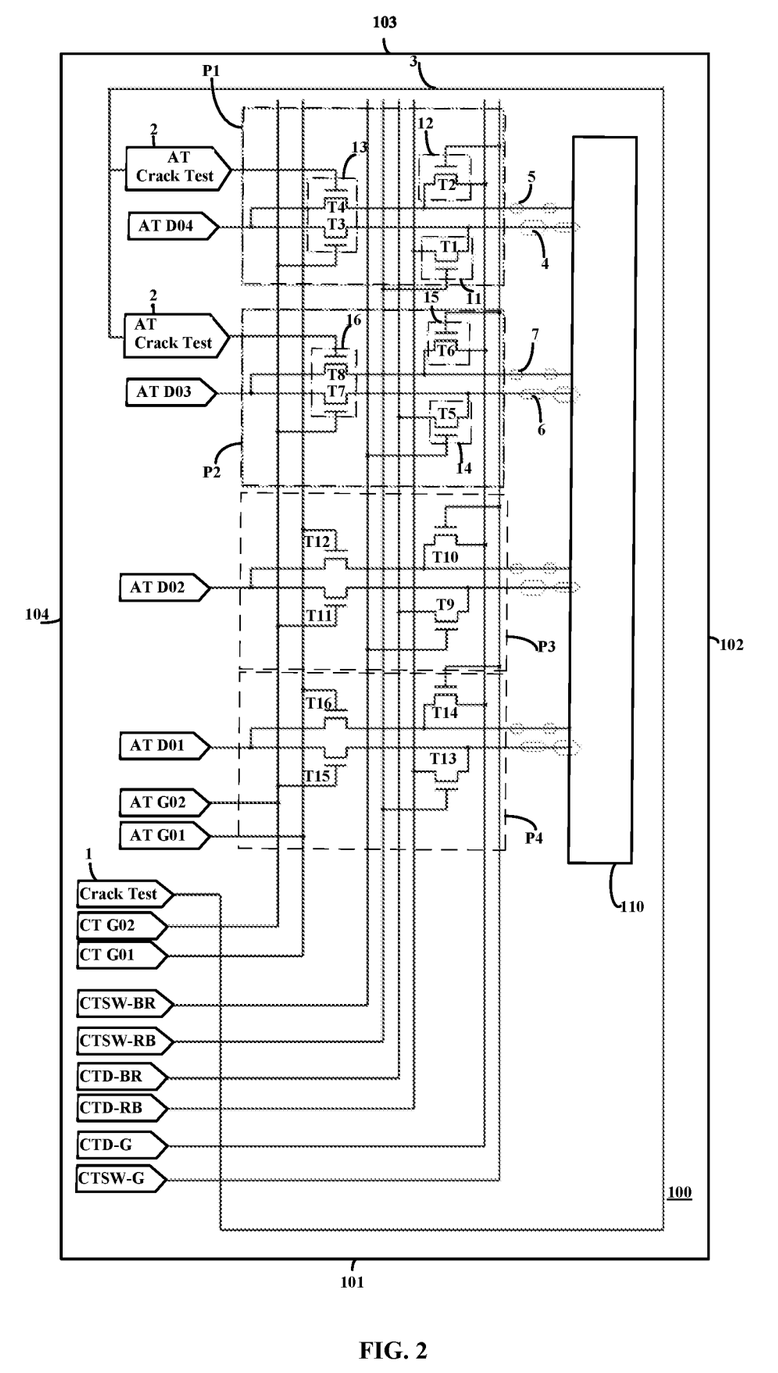
FIG. 2 shows a schematic diagram of the structure of a pixel detection circuit according to an embodiment of the present disclosure.

The present disclosure provides a pixel detection circuit, as shown in FIGS. 1 and 2, comprising: a wire 3, and at least one detection signal input terminal 1 and at least one detection signal output terminal 2 electrically connected to both ends of the wire 3, respectively. The wire 3 is arranged at an edge of a first side 101, a second side 102, and a third side 103 of a display panel 100 to be detected.

A first pixel drive circuit P1 comprises a first switch circuit 11, a second switch circuit 12, and a third switch circuit 13. The first pixel drive circuit P1 is configured to drive the first light-emitting element of the first column of pixels 4 and the second light-emitting element of the second column of pixels 5.

The first switch circuit 11 has a first terminal electrically connected to a first control signal line CTSW-RB, a second terminal electrically connected to a first data signal line CTD-RB, and a third terminal electrically connected to the first column of pixels 4. The first switch circuit 11 provides a potential of the second terminal of the first switch circuit to the third terminal of the first switch circuit 11 under the control of the first terminal of the first switch circuit 11.

The second switch circuit 12 has a first terminal electrically connected to a second control signal line CTSW-G, a second terminal electrically connected to a second data signal line CTD-G, and a third terminal electrically connected to the second column of pixels 5. The second switch circuit 12 is configured to provide a potential of the second terminal of the second switch circuit 12 to the third terminal of the second switch circuit 12 under the control of the first terminal of the second switch circuit 12.

The third switch circuit 13 has a first terminal electrically connected to one of the at least one detection signal output terminal 2, a second terminal electrically connected to the third terminal of the first switch circuit 11, and a third terminal electrically connected to the second column of pixels 5. The third switch circuit 13 is configured to provide a potential of the second terminal of the third switch circuit 13 to the third terminal of the third switch circuit 13 under the control of the first terminal of the third switch circuit 13.

The present disclosure provides the detection signal input terminal 1, the detection signal output terminal 2, and the wire 3. The detection signal input terminal 1 and the detection signal output terminal 2 are connected through the wire 3 to form a detection circuit, and then it is determined whether the detection signal can be transmitted from the detection signal input terminal 1 to the detection signal output terminal 2, so as to determine whether the wire 3 is broken based on whether the third switch circuit 13 is turned on or not. If the wire 3 is not broken, the detection signal can be transmitted to the first terminal of the third switch circuit 13, so that the third switch circuit 13 is turned on, then the first data signal can be written into the second light-emitting element of the second column of pixels 5, so that the second light-emitting element of the second column of pixels 5 does not emit light. If the wire 3 is broken, the detection signal cannot be transmitted to the first terminal of the third switch circuit 13, so that the third switch circuit 13 is in OFF state, then the first data signal cannot be written into the second light-emitting element of the second column of pixels 5, so that the second light-emitting element of the second column of pixels 5 emits light. Therefore, it can be determined whether the wire 3 is broken according to whether the second light-emitting element of the second column of pixels 5 emits light or not, that is, whether there is a bright line on the display panel 100, thereby determining whether the edge of the display panel 100 is cracked. The present disclosure does not require additional PCD circuits, which simplifies the PCD circuits, saves space, and avoids display problems caused by abnormalities or defects in the PCD circuits.

Those skilled in the art may think that, in practical applications, it can also be designed that when the first data signal is written into the second light-emitting element of the second column of pixels 5, the second light-emitting element of the second column of pixels 5 emits light; and when the first data signal is not written into the second light-emitting element of the second column of pixels 5, the second light-emitting element of the second column of pixels 5 does not emit light. According to different pre-designed conditions of whether to emit light, it is determined whether the wire 3 is broken.

For example, the first switch circuit 11 comprises a first transistor T1 having a control electrode, a first electrode, and a second electrode serving as the first terminal, the second terminal, and the third terminal of the first switch circuit 11, respectively.

The second switch circuit 12 comprises a second transistor T2 having a control electrode, a first electrode, and a second electrode serving as the first terminal, the second terminal, and the third terminal of the second switch circuit 12, respectively.

For example, the third switch circuit 13 comprises a third transistor T3 and a fourth transistor T4. The third transistor T3 has a control electrode electrically connected to the third control signal line CT G02, a first electrode serving as the second terminal of the third switch circuit 13, and a second electrode electrically connected to a first electrode of the fourth transistor T4. The fourth transistor T4 has a control electrode serving as the first terminal of the third switch circuit 13, and a second electrode serving as the third terminal of the third switch circuit 13.

For example, the pixel detection circuit further comprises: a second pixel drive circuit P2 comprising a fourth switch circuit 14, a fifth switch circuit 15, and a sixth switch circuit 16. The second pixel drive circuit P2 is configured to drive a third light-emitting element of a third column of pixels 6 and a fourth light-emitting element of a fourth column of pixels 7.

The fourth switch circuit 14 has a first terminal electrically connected to a fourth control signal line CTSW-BR, a second terminal electrically connected to a fourth data signal line CTD-BR, and a third terminal electrically connected to the third column of pixels 6. The fourth switch circuit 14 is configured to provide a potential of the second terminal of the fourth switch circuit 14 to the third terminal of the fourth switch circuit 14 under the control of the first terminal of the fourth switch circuit 14.

The fifth switch circuit 15 has a first terminal electrically connected to the second control signal line CTSW-G, a second terminal electrically connected to the second data signal line CTD-G, and a third terminal electrically connected to the fourth column of pixels 7. The fifth switch circuit 15 is configured to provide a potential of the second terminal of the fifth switch circuit 15 to the third terminal of the fifth switch circuit 15 under the control of the first terminal of the fifth switch circuit 15.

The sixth switch circuit 16 has a first terminal electrically connected to another detection signal output terminal of the at least one detection signal output terminal 2, a second terminal of the sixth switch circuit 16 electrically connected to the third terminal of the fourth switch circuit 14, and a third terminal of the sixth switch circuit 16 electrically connected to the fourth column of pixels 7. The sixth switch circuit 16 is configured to provide a potential of the second terminal of the sixth switch circuit 16 to the third terminal of the sixth switch circuit 16 under the control of the first terminal of the sixth switch circuit 16.

As an example, an embodiment of the present disclosure provides two groups of pixel drive circuits with detection circuits, namely the first pixel drive circuit P1 and the second pixel drive circuit P2. In the case of the wire 3 is broken, both the second light-emitting element of the second column of pixels 5 and the fourth light-emitting element of the fourth column of pixels 7 emit light, and two columns of bright lines appear on the display panel 100.

The present disclosure may provide one group of pixel drive circuit with detection circuit, two groups of pixel drive circuits with detection circuits, or a plurality of groups of pixel drive circuits with detection circuits. The number of the pixel drive circuits with detection circuits may be set according to actual detection needs, and then the number of the detection signal input terminals 1 and the detection signal output terminals 2 may be set according to the number of the pixel drive circuits with detection circuits.

In the case of the number of the wire 3 surrounding the display area 110 of the display panel 100 is one, the number of the detection signal input terminal 1 may be set to one, and the number of the detection signal output terminal 2 is the same as the number of the pixel drive circuit with detection circuit. That is to say, one pixel drive circuit is electrically connected to one corresponding detection signal output terminal 2. For example, in the case of the pixel detection circuit comprises the first pixel drive circuit P1 and the second pixel drive circuit P2, one detection signal input terminal 1 and two detection signal output terminals 2 may be provided, the first terminal of the third switch circuit 13 and the first terminal of the sixth switch circuit 16 are electrically connected to the two detection signal output terminals 2, respectively.

As shown in FIG. 2, the display panel 100 has a first side 101, a second side 102, a third side 103, and a fourth side 104. Two wires 3 are respectively provided on an edge of the first side 101 and the second side 102 of the display panel 100 and an edge of the second side 102 and the third side 103 of the display panel 100. The number of the detection signal input terminals 1 and the detection signal output terminals 2 are at least two, and the number of the pixel drive circuits is set according to the number of the detection signal output terminals 2. For example, in the case of the number of the detection signal input terminals 1 and the number of the detection signal output terminals 2 are respectively two, two groups of pixel drive circuits with detection circuits may be provided. Each of the pixel drive circuits is electrically connected to one of the detection signal output terminals 2 on the same wire 3. It may be determined by which group of pixel drive circuits emitting light that the left or right edge of the display panel 100 is cracked.

For example, the fourth switch circuit 14 comprises a fifth transistor T5 having a control electrode, a first electrode, and a second electrode serving as the first terminal, the second terminal, and the third terminal of the fourth switch circuit 14, respectively.

The fifth switch circuit 15 comprises a sixth transistor T6 having a control electrode, a first electrode, and a second electrode serving as the first terminal, the second terminal, and the third terminal of the fifth switch circuit 15, respectively.

For example, the sixth switch circuit 16 comprises a seventh transistor T7 and an eighth transistor T8. The seventh transistor T7 has a control electrode electrically connected to the third control signal line CT G02, a first electrode serving as the second terminal of the sixth switch circuit 16, and a second electrode electrically connected to a first electrode of the eighth transistor T8. The eighth transistor T8 has a control electrode serving as the first terminal of the sixth switch circuit 16, and a second electrode serving as the third terminal of the sixth switch circuit 16.

For example, each of the transistors is a thin film transistor (TFT), and the control electrode of any transistor is a gate of the thin film transistor. If the first electrode of the thin film transistor is a source of the thin film transistor, the second electrode of the transistor is a drain of the thin film transistor. If the first electrode of the transistor is the drain of the thin film transistor, the second electrode of the transistor is the source of the thin film transistor.

For example, the wire 3 is a metal wire arranged on the array substrate and arranged on the edges of the first side 101, the second side 102 and the third side 103 of the display panel 100. All light-emitting elements are organic light-emitting diodes (OLEDs).

As shown in FIG. 2, the structure of a pixel detection circuit of the present disclosure is provided. In the above embodiment, the first light-emitting element of the first column of pixels 4 and the third light-emitting element of the third column of pixels 6 are B/R pixels and R/B pixels, respectively, and the second light-emitting element of the second column of pixels 5 and the fourth light-emitting element of the fourth column of pixels 7 are G pixels. The first control signal line CTSW-RB is used to receive the control signals of the red and blue sub-pixels in the same column in the display panel cell test. The second control signal line CTSW-G is used to receive the control signal of the green sub-pixels in the display panel cell test. The third control signal line CT G02 is used to receive the gate signal controlling the conduction of the AT unit. The first data signal line CTD-RB is used to receive the data signals of the red and blue sub-pixels in the same column in the display panel cell test. The second data signal line CTD-G is used to receive the data signals of the green sub-pixels in the display panel cell test. The fourth data signal line CTD-BR is used to receive the data signals of the red and blue sub-pixels in the same column in the display panel cell test. As an example, FIG. 2 shows other circuits including a third pixel drive circuit P3 and a fourth pixel drive circuit P4 on the array substrate.

The third pixel drive circuit P3 comprises a ninth transistor T9, a tenth transistor T10, an eleventh transistor T11, and a twelfth transistor T12. The structure of the third pixel drive circuit P3 is similar to that of the first pixel drive circuit P1, except a gate of the ninth transistor T9 receives the control signals of the red and blue sub-pixels in the same column in the display panel cell test through the fourth control signal line CTSW-BR, and a gate of the twelfth transistor T12 receives the gate signal controlling the conduction of the AT unit through the fifth control signal line CT G01. The fourth pixel drive circuit P4 comprises a thirteenth transistor T13, a fourteenth transistor T14, a fifteenth transistor T15, and a sixteenth transistor T16. The structure of the fourth pixel drive circuit P4 is similar to that of the second pixel drive circuit P2, except a gate of the thirteenth transistor T13 is electrically connected to the first control signal line CTSW-RB, and a gate of the sixteenth transistor T16 is electrically connected to the fifth control signal line CT G01. The third pixel drive circuit P3 and the fourth pixel drive circuit P4 serve as an example of the implementation of the circuit.

In addition, the third transistor T3 and the fourth transistor T4 is electrically connected to an ATD04 (Array Test Data 04, array substrate detection data signal 04) port, and the seventh transistor T7 and the eighth transistor T8 is electrically connected to an ATD03 (Array Test Data 03, array substrate detection data signal 03) port, the eleventh transistor T11 and the twelfth transistor T12 is electrically connected to an ATD02 (Array Test Data 02, array substrate detection data signal 02) port, and the fifteenth transistor T15 and the sixteenth transistor T16 is electrically connected to an ATD01 (Array Test Data 01, array substrate detection data signal 01) port. The fifth control signal line CT G01 is further connected with an ATG01 (Array Test gate 01, array substrate detection gate signal 01) port, and the third control signal line CT G02 is further connected with an AT G02 (Array Test gate 02, array substrate detection gate signal 02) port. The AT G01 port, AT G02 port, ATD01 port, ATD02 port, ATD03 port, and ATD04 port are applicable to an example of AT (Array Test) as the implementation of the circuit.

Those skilled in the art can understand that according to an example of the pixel detection circuit provided by the embodiment of the present disclosure, when each of the transistors is a P-type TFT or an N-type TFT, or the first and second electrodes of each of the transistors are different electrodes of the TFT, the electrical connection of each element in the pixel detection circuit provided by the embodiment of the present disclosure may be adjusted adaptively, and the adaptively adjusted electrical connection still belongs to the protection scope of the embodiment of the present disclosure.

Based on the same concept, the present disclosure further provides a display device comprising the aforementioned pixel detection circuit.

Based on the same concept, an embodiment of the present disclosure further provides a detection method applied to the aforementioned pixel detection circuit, the detection method comprising the following steps.

Figure 3:
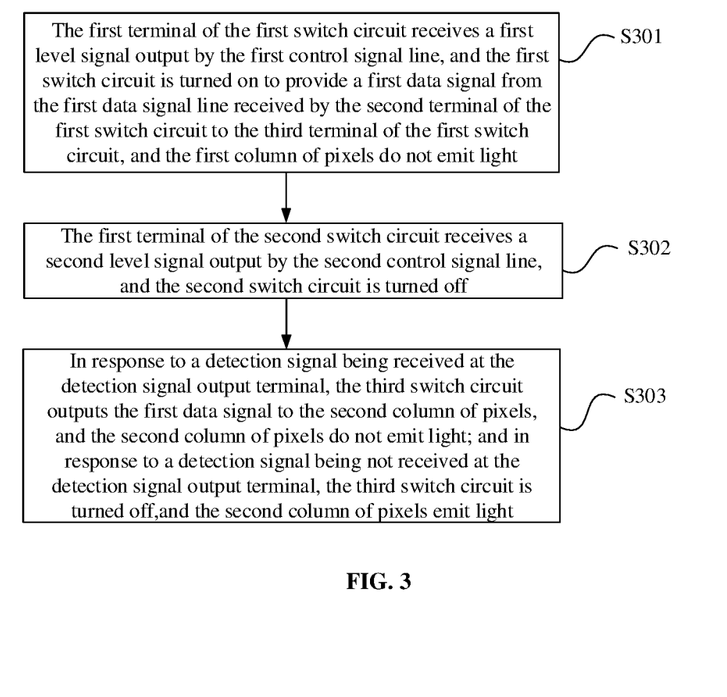
FIG. 3 shows a flowchart of a detection method according to an embodiment of the present disclosure.

In S301, the first terminal of the first switch circuit 11 receives a first level signal output by the first control signal line CTSW-RB, and the first switch circuit 11 is turned on, so as to provide a first data signal from the first data signal line CTD-RB received by the second terminal of the first switch circuit 11 to the third terminal of the first switch circuit 11, so that the first column of pixels 4 do not emit light.

In S302, the first terminal of the second switch circuit 12 receives a second level signal output by the second control signal line CTSW-G, and the second switch circuit 12 is turned off.

In S303, in response to a detection signal being received at the detection signal output terminal 2, the third switch circuit 13 outputs the first data signal to the second column of pixels 5, so that the second column of pixels 5 do not emit light; and in response to a detection signal being not received at the detection signal output terminal 2, the third switch circuit 13 is turned off, so that the second column of pixels 5 emit light.

For example, the third switch circuit 13 comprises the third transistor T3 and the fourth transistor T4. The control electrode of the third transistor T3 is electrically connected to the third control signal line CT G02. The control electrode of the fourth transistor T4 serves as the first terminal of the third switch circuit 13. The first electrode of the third transistor T3 serves as the second terminal of the third switch circuit 13. The second electrode of the third transistor T3 is electrically connected to the first electrode of the fourth transistor T4. The second electrode of the fourth transistor T4 serves as the third terminal of the third switch circuit 13. The third level signal is output via the third control signal line.

In the above step S301, the control electrode of the third transistor T3 may further receive the third level signal output by the third control signal line, so that the third transistor is turned on.

In the above step S302, if the wire 3 is not broken, the fourth transistor T4 is turned on in response to the detection signal being received at the control electrode of the fourth transistor T4, so as to enable the first data signal to be transmitted to the second column of pixels 5 via the third transistor T3 and the fourth transistor T4, so that the second column of pixels 5 do not emit light.

In the above step S303, if the wire 3 is broken, the fourth transistor T4 is turned off in response to the detection signal being not received at the control electrode of the fourth transistor T4, so as to disable the first data signal to be transmitted to the second column of pixels 5 via the third transistor T3 and the fourth transistor T4, so that the second column of pixels 5 emit light.

For example, the pixel detection circuit of the embodiment of the present disclosure further comprises a second pixel drive circuit configured to drive the third light-emitting element of the third column of pixels 6 and the fourth light-emitting element of the fourth column of pixels 7. The second pixel drive circuit comprises a fourth switch circuit 14, a fifth switch circuit 15, and a sixth switch circuit 16. The fourth switch circuit 14 has a first terminal, a second terminal, and a third terminal electrically connected to the fourth control signal line CTSW-BR, the fourth data signal line CTD-BR and the third light-emitting element of the third column of pixels 6, respectively. The fifth switch circuit 15 has a first terminal, a second terminal and a third terminal electrically connected to the second control signal line, the second data signal line CTD-G and the fourth light-emitting element of the fourth column of pixels 7, respectively. The sixth switch circuit 16 has a first terminal and a second terminal electrically connected to one of the detection signal output terminals 2 and the third terminal of the fourth switch circuit 14, respectively. The sixth switch circuit 16 has a third terminal electrically connected to the fourth light-emitting element of the fourth column of pixels 7.

The detection method applied to the aforementioned pixel detection circuit further comprises the following steps.

Figure 4:
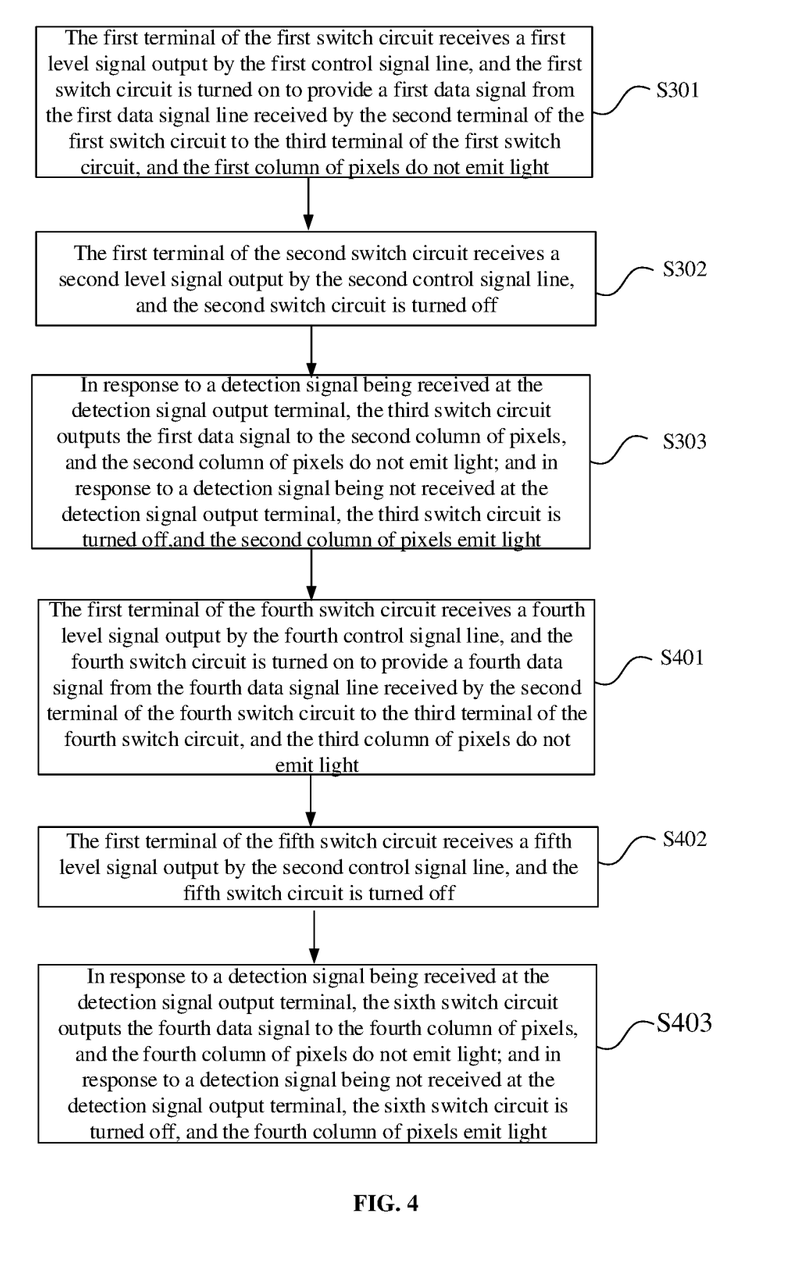
FIG. 4 shows a flowchart of another detection method according to an embodiment of the present disclosure.

In S401, the first terminal of the fourth switch circuit 14 receives a fourth level signal output by the fourth control signal line CTSW-RB, and the fourth switch circuit 14 is turned on, so as to provide a fourth data signal from the fourth data signal line CTD-BR received by the second terminal of the fourth switch circuit 14 to the third terminal of the fourth switch circuit 14, so that the third column of pixels 6 do not emit light.

In S402, the first terminal of the fifth switch circuit 15 receives a fifth level signal output by the second control signal line, and the fifth switch circuit is turned off.

In S403, in response to a detection signal being received at the detection signal output terminal 2, the sixth switch circuit 16 outputs the fourth data signal to the fourth column of pixels 7, so that the fourth column of pixels 7 do not emit light; and in response to a detection signal being not received at the detection signal output terminal 2, the sixth switch circuit 16 is turned off, so that the fourth column of pixels 7 emit light.

For example, the steps S301, S302, S303 and the steps S401, S402, S403 can be performed simultaneously.

Similarly, the sixth switch circuit 16 comprises a seventh transistor T7 and an eighth transistor T8. A control electrode of the seventh transistor T7 is electrically connected to the third control signal line. The control electrode of the eighth transistor T8 serves as the first terminal of the sixth switch circuit 16. The first electrode of the seventh transistor T7 serves as the second terminal of the sixth switch circuit 16. The second electrode of the seventh transistor T7 is electrically connected to the first electrode of the eighth transistor T8. The second electrode of the eighth transistor T8 serves as the third terminal of the sixth switch circuit 16.

In the above step S401, the control electrode of the seventh transistor T7 may further receive the sixth level signal output by the third control signal line, so that the seventh transistor T7 is turned on.

In the above step S402, if the wire 3 is not broken, the eighth transistor T8 is turned on in response to the detection signal being received at the control electrode of the eighth transistor T8, so as to enable the fourth data signal to be transmitted to the fourth column of pixels 7 via the seventh transistor T7 and the eighth transistor T8, so that the fourth column of pixels 7 do not emit light.

In the above step S403, if the wire 3 is broken, the eighth transistor T8 is turned off in response to the detection signal being not received at the control electrode of the eighth transistor T8, so as to disable the fourth data signal to be transmitted to the fourth column of pixels 7 via the seventh transistor T7 and the eighth transistor T8, so that the fourth column of pixels 7 emit light.

Referring to FIGS. 2, 3 and 4, taking the case where each transistor is a P-type thin film transistor TFT as an example, the pixel detection method provided by the embodiment of the present disclosure is introduced as follows.

The CTSW-G port is controlled to keep outputting high level signals, that is, the second level signal and the fifth level signal are both high level signals. The second transistor T2, the sixth transistor T6, the tenth transistor T10, and the fourteenth transistor T14 in FIG. 2 are turned off, that is, the data signal of the CTD-G port cannot be written into the second light-emitting element of the second column of pixels 5 and the fourth light-emitting element of the fourth column of pixels 7, nor can it be written into the two columns of pixels connected with the tenth transistor T10 and the fourteenth transistor T14.

The CTD-RB port and the CTD-BR port are controlled to keep outputting high level signals, that is, the first data signal and the fourth data signal are high level signals. The CTSW-RB port and the CTSW-BR port maintain low level signals, that is, the first level signal and the fourth level signal are low level signals. The first transistor T1, the fifth transistor T5, the ninth transistor T9, and the thirteenth transistor T13 are turned on. High level signals are written into the first light-emitting element of the first column of pixels 4 and the third light-emitting element of the third column of pixels 6, so that the first light-emitting element of the first column of pixels 4 and the third light-emitting element of the third column of pixels 6 do not emit light, and the two columns of pixels electrically connected with the ninth transistor T9 and the thirteenth transistor T13 do not emit light, either.

The CT G02 port is kept to output low level signals, that is, the third level signal and the sixth level signal are low level signals. The third transistor T3, the seventh transistor T7, the eleventh transistor T11, and the fifteenth transistor T15 are turned on.

The detection signal is also controlled as a low level signal. If the wire 3 is not broken, the detection signals sequentially pass through the detection signal input terminal 1, the wire 3, and the detection signal output terminal 2, and are then transmitted to the control electrodes of the fourth transistor T4 and the eighth transistor T8, so that the fourth transistor T4 and the eighth transistor T8 are turned on. The first data signal is output to the second light-emitting element of the second column of pixels 5 through the first transistor T1, the third transistor T3, and the fourth transistor T4, so that the second light-emitting element of the second column of pixels 5 does not emit light. The fourth data signal is output to the fourth light-emitting element of the fourth column of pixels 7 through the fifth transistor T5, the seventh transistor T7, and the eighth transistor T8, so that the fourth light-emitting element of the fourth column of pixels 7 does not emit light, and the display panel appears black. The CT G01 port is kept outputting low-level signals, so that the twelfth transistor T12 and the sixteenth transistor T16 are in ON state. The high level signal of the thirteenth transistor T13 is transmitted through the fifteenth transistor T15 and the sixteenth transistor T16 to the pixels connected with the sixteenth transistor T16. The high level signal of the ninth transistor T9 is transmitted through the eleventh transistor 11 and the twelfth transistor T12 to the pixels connected with the twelfth transistor T12. That is, the pixels connected with the third and fourth pixel drive circuits not connected to the detection circuit are always in a non-light-emitting state, which does not affect the detection of the display panel by the detection circuit.

If the wire 3 is broken, the detection signal cannot control the fourth transistor T4 and the eighth transistor T8 to be turned on, and the first data signal and the fourth data signal cannot be correspondingly transmitted to the second light-emitting element of the second column of pixels 5 and the fourth light-emitting element of the fourth column of pixels 7. Then the second column of pixels 5 and the fourth column of pixels 7 are almost in a floating state of zero potential, so that the second light-emitting element of the second column of pixels 5 and the fourth light-emitting element of the fourth column of pixels 7 emit light, and two columns of bright lines appear on the display panel, therefore it can be determined that the edges of the display panel are cracked.

In addition, based on the circuit structure shown in FIG. 2, the array substrate test AT can be performed. During the detection, the AT G01 port, the AT G02 port, and the AT Crack Test port output low level signals, the third transistor T3, the fourth transistor T4, the seventh transistor T7, the eighth transistor T8, the eleventh transistor T11, the twelfth transistor T12, the fifteenth transistor T15, and the sixteenth transistor T16 are turned on. The data signals of the ATD01 port, the ATD02 port, the ATD03 port, and the ATD04 port are written, and the array substrate test AT is performed.

Based on the circuit structure shown in FIG. 2, the cell electrical test of the display panel may be performed. During the detection, the Crack Test port, CT G01 port, and CT G02 port are controlled to output high level signals, so as to control the third transistor T3, the fourth transistor T4, the seventh transistor T7, the eighth transistor T8, the eleventh transistor T11, the twelfth transistor T12, the fifteenth transistor T15, and the sixteenth transistor T16 in the array substrate test AT unit to be turned off to avoid signal crosstalk. When MDL (module display panel) displays, the third transistor T3, the fourth transistor T4, the seventh transistor T7, the eighth transistor T8, the eleventh transistor T11, the twelfth transistor T12, the fifteenth transistor T15, and the sixteenth transistor T16 in the array substrate test AT unit are also controlled to be turned off to avoid signal crosstalk.

Therefore, the pixel detection circuit of the present disclosure does not interfere with the detection of the AT, Cell ET, and MDL display when detecting whether the edge of the display panel is cracked, and has strong applicability.

The present disclosure connects the detection signal input terminal and the detection signal output terminal using a wire surrounding the edge of the display panel to be detected. The first pixel drive circuit comprises a first switch circuit, a second switch circuit, and a third switch circuit. The second terminal of the first switch circuit receives the first data signal, and the first light-emitting element of the first column of pixels does not emit light. The second switch circuit remains off to control that no data signal is written into the second light-emitting element of the second column of pixels through the second switch circuit. The first data signal may be written into the second light-emitting element of the second column of pixels through the path of the first switch circuit and the third switch circuit, therefore whether the second light-emitting element emits light or not is controlled by the third switch circuit.

If the wire is not broken, the detection signal passes through the detection signal input terminal, the wire, and the detection signal output terminal sequentially and is then transmitted to the first terminal of the third switch circuit, so that the third switch circuit is turned on. The first data signal may be written into the second light-emitting element of the second column of pixels, so that the second light-emitting element of the second column of pixels do not emit light, and the display panel appears black.

If the wire is broken, the detection signal cannot be transmitted to the first terminal of the third switch circuit, then the detection signal cannot control the first terminal of the third switch circuit to turn on, and the third switch circuit is in OFF state, so that the second light-emitting element of the second column of pixels emits light, and a bright line appears on the display panel, therefore it is determined that the wire is broken and the edge of the display panel is cracked.

By adding a detection signal input terminal and a detection signal output terminal, and then connecting the detection signal input terminal and the detection signal output terminal using a wire, the present disclosure forms a detection circuit. Additional PCD circuits are not needed, which simplifies the PCD circuits and saves space, and avoids display problems caused by abnormalities or defects in the PCD circuits.

The display apparatus and the detection method provided by the embodiments of the present disclosure have the same concept and the same beneficial effects as the pixel detection circuit of the foregoing embodiments. The contents of the display apparatus and the detection method that are not shown in detail may be understood with reference to the aforementioned embodiments, and will not be repeated here.

Those skilled in the art can understand that steps, measures, and schemes in various operations, methods, and processes that have been discussed in the present disclosure can be alternated, modified, combined, or deleted. Further, other steps, measures, and schemes in the various operations, methods and, processes that have been discussed in the present disclosure may also be alternated, modified, rearranged, decomposed, combined, or deleted. Further, steps, measures, and schemes in various operations, methods, and processes disclosed in the related art may also be alternated, modified, rearranged, decomposed, combined, or deleted.

The terms "first" and "second" are used for descriptive purposes and cannot be understood as indicating or implying relative importance or implicitly indicating the number of indicated technical features. Thus, the features defined as "first" and "second" may explicitly or implicitly include one or more of the features. In the description of the present disclosure, unless otherwise stated, "a plurality of" means two or more. The words "include", "comprise" and the like mean that the elements or objects appearing before the word cover the elements or objects listed after the word and their equivalents, but do not exclude other elements or objects. The words "connected," "coupled" and the like are not limited to physical or mechanical connections, but may include electrical connections, whether direct or indirect.

The orientation or positional relationships indicated by the terms "center", "upper", "lower", "front", "back", "left", "right", "vertical", "horizontal", "top", "bottom", "inner", "outside" and others are based on the orientation or positional relationships shown in the drawings, to facilitate the description of the present disclosure and simplify the description, rather than to indicate or imply that the device or element referred to have a specific orientation, be configured and operated in a specific orientation, and cannot therefore be understood as a limitation of the present disclosure. When an element such as a layer, a film, a region, or a substrate is referred to be located "above" or "below" another element, the element can be "directly" located "above" or "below" another element, or there may be an intermediate element.

It should be understood that although the steps in the flowchart in the drawings are displayed in order according to the arrows, the steps are not necessarily executed in the order indicated by the arrows. Unless there is a clear description, the execution of these steps is not strictly limited in order, and they can be executed in other orders. Moreover, at least a part of the steps in the flowchart in the drawings may include multiple sub-steps or multiple stages. These sub-steps or stages are not necessarily executed at the same time, but may be executed at different times, and the execution order is not necessarily carried out sequentially, but may be executed in turn or alternately with at least a part of other steps or sub-steps or stages of other steps.

The above is the preferred embodiments of the present disclosure. It should be noted that for those ordinary skilled in the art, without departing from the principles described in the present disclosure, several improvements and retouches can be made. These improvements and retouches should also be regarded as the scope of protection of the present disclosure.

What is claimed is:

1. A pixel detection circuit, comprising:
   a wire arranged on an edge of a display panel to be detected;
   at least one detection signal input terminal electrically connected to a first end of the wire;

at least one detection signal output terminal electrically connected to a second end of the wire; and a first pixel drive circuit, comprising:
- a first switch circuit having a first terminal electrically connected to a first control signal line, a second terminal electrically connected to a first data signal line, and a third terminal electrically connected to a first column of pixels, the first switch circuit being configured to provide a potential of the second terminal of the first switch circuit to the third terminal of the first switch circuit under the control of the first terminal of the first switch circuit;
- a second switch circuit having a first terminal electrically connected to a second control signal line, a second terminal electrically connected to a second data signal line, and a third terminal electrically connected to a second column of pixels, the second switch circuit being configured to provide a potential of the second terminal of the second switch circuit to the third terminal of the second switch circuit under the control of the first terminal of the second switch circuit; and
- a third switch circuit having a first terminal electrically connected to one of the at least one detection signal output terminal, a second terminal electrically connected to the third terminal of the first switch circuit, and a third terminal electrically connected to the second column of pixels, the third switch circuit being configured to provide a potential of the second terminal of the third switch circuit to the third terminal of the third switch circuit under the control of the first terminal of the third switch circuit.

2. The pixel detection circuit according to claim 1, wherein the first switch circuit comprises:
- a first transistor having a control electrode serving as the first terminal of the first switch circuit, a first electrode serving as the second terminal of the first switch circuit, and a second electrode serving as the third terminal of the first switch circuit.

3. The pixel detection circuit according to claim 1, wherein the second switch circuit comprises:
- a second transistor having a control electrode serving as the first terminal of the second switch circuit, a first electrode serving as the second terminal of the second switch circuit, and a second electrode serving as the third terminal of the second switch circuit.

4. The pixel detection circuit according to claim 1, wherein the third switch circuit comprises a third transistor and a fourth transistor,
- wherein the third transistor has a control electrode electrically connected to a third control signal line, a first electrode serving as the second terminal of the third switch circuit, and a second electrode electrically connected to a first electrode of the fourth transistor; and
- wherein the fourth transistor has a control electrode serving as the first terminal of the third switch circuit, and a second electrode serving as the third terminal of the third switch circuit.

5. The pixel detection circuit according to claim 1, further comprising a second pixel drive circuit configured to drive a third column of pixels and a fourth column of pixels, wherein the second pixel drive circuit comprises:
- a fourth switch circuit having a first terminal electrically connected to a fourth control signal line, a second terminal electrically connected to a fourth data signal line, and a third terminal electrically connected to the third column of pixels, the fourth switch circuit being configured to provide a potential of the second terminal of the fourth switch circuit to the third terminal of the fourth switch circuit under the control of the first terminal of the fourth switch circuit;
- a fifth switch circuit having a first terminal electrically connected to the second control signal line, a second terminal electrically connected to the second data signal line, and a third terminal electrically connected to a fourth column of pixels, the fifth switch circuit being configured to provide a potential of the second terminal of the fifth switch circuit to the third terminal of the fifth switch circuit under the control of the first terminal of the fifth switch circuit; and
- a sixth switch circuit having a first terminal electrically connected to another detection signal output terminal of the at least one detection signal output terminal, a second terminal electrically connected to the third terminal of the fourth switch circuit, and a third terminal electrically connected to the fourth column of pixels, the sixth switch circuit being configured to provide a potential of the second terminal of the sixth switch circuit to the third terminal of the sixth switch circuit under the control of the first terminal of the sixth switch circuit.

6. The pixel detection circuit according to claim 5, wherein the fourth switch circuit comprises:
- a fifth transistor having a control electrode serving as the first terminal of the fourth switch circuit, a first electrode serving as the second terminal of the fourth switch circuit, and a second electrode serving as the third terminal of the fourth switch circuit.

7. The pixel detection circuit according to claim 5, wherein the fifth switch circuit comprises:
- a sixth transistor having a control electrode serving as the first terminal of the fifth switch circuit, a first electrode serving as the second terminal of the fifth switch circuit, and a second electrode serving as the third terminal of the fifth switch circuit.

8. The pixel detection circuit according to claim 5, wherein the sixth switch circuit comprises a seventh transistor and an eighth transistor;
- wherein the seventh transistor has a control electrode electrically connected to a third control signal line, a first electrode serving as the second terminal of the sixth switch circuit, and a second electrode electrically connected to a first electrode of the eighth transistor; and
- wherein the eighth transistor has a control electrode serving as the first terminal of the sixth switch circuit, and a second electrode serving as the third terminal of the sixth switch circuit.

9. A display apparatus, comprising: the pixel detection circuit according to claim 1.

10. A detection method applied to a pixel detection circuit, wherein the pixel detection circuit comprises:
- a wire arranged on an edge of a display panel to be detected;
- at least one detection signal input terminal electrically connected to a first end of the wire;
- at least one detection signal output terminal electrically connected to a second end of the wire; and
- a first pixel drive circuit, comprising:
  - a first switch circuit having a first terminal electrically connected to a first control signal line, a second terminal electrically connected to a first data signal line, and a third terminal electrically connected to a first column of pixels, the first switch circuit being configured to provide a potential of the second terminal of the first switch circuit to the third terminal of the first switch circuit under the control of the first terminal of the first switch circuit;

a second switch circuit having a first terminal electrically connected to a second control signal line, a second terminal electrically connected to a second data signal line, and a third terminal electrically connected to a second column of pixels, the second switch circuit being configured to provide a potential of the second terminal of the second switch circuit to the third terminal of the second switch circuit under the control of the first terminal of the second switch circuit; and a third switch circuit having a first terminal electrically connected to one of the at least one detection signal output terminal, a second terminal electrically connected to the third terminal of the first switch circuit, and a third terminal electrically connected to the second column of pixels, the third switch circuit being configured to provide a potential of the second terminal of the third switch circuit to the third terminal of the third switch circuit under the control of the first terminal of the third switch circuit, the method comprising:

receiving, by the first terminal of the first switch circuit, a first level signal output by the first control signal line, and the first switch circuit being turned on to provide a first data signal from the first data signal line received by the second terminal of the first switch circuit to the third terminal of the first switch circuit, so that the first column of pixels do not emit light;

receiving, by the first terminal of the second switch circuit, a second level signal output by the second control signal line, and the second switch circuit being turned off;

in response to a detection signal being received at the detection signal output terminal, outputting, by the third switch circuit, the first data signal to the second column of pixels, so that the second column of pixels do not emit light; and in response to the detection signal being not received at the detection signal output terminal, the third switch circuit being turned off, so that the second column of pixels emit light.

11. The detection method according to claim 10, wherein the third switch circuit comprises a third transistor and a fourth transistor, the third transistor having a control electrode electrically connected to a third control signal line, a first electrode serving as the second terminal of the third switch circuit, and a second electrode electrically connected to a first electrode of the fourth transistor, and the fourth transistor having a control electrode serving as the first terminal of the third switch circuit, and a second electrode serving as the third terminal of the third switch circuit; wherein the method further comprises:

receiving, by the control electrode of the third transistor, a third level signal output by the third control signal line, the third transistor being turned on;

in response to the detection signal being received at the control electrode of the fourth transistor, the fourth transistor being turned on, and the first data signal being transmitted to the second column of pixels through the third transistor and the fourth transistor, so that the second column of pixels do not emit light; and in response to the detection signal being not received at the control electrode of the fourth transistor, the fourth transistor being turned off, and the first data signal not being transmitted to the second column of pixels through the third transistor and the fourth transistor, so that the second column of pixels emit light.

* * * * *